United States Patent
Lee et al.

(10) Patent No.: US 7,220,651 B2
(45) Date of Patent: May 22, 2007

(54) TRANSISTOR AND METHOD FOR MANUFACTURING THE SAME

(75) Inventors: Sang Don Lee, Gyeonggi-do (KR); Yil Wook Kim, Seoul (KR); Jin Hong Ahn, Gyeonggi-do (KR); Young Jun Park, Seoul (KR)

(73) Assignee: Hynix Semiconductor, Inc, Icheon-Si, Gyeonggi-Do ( * ) Notice: Subject to any disclaimer, the term of this patent is extended or adjusted under 35 U.S.C. 154(b) by 164 days.

(21) Appl. No.: 10/876,477

(22) Filed: Jun. 28, 2004

(65) Prior Publication Data

US 2005/0202643 A1   Sep. 15, 2005

(30) Foreign Application Priority Data

Mar. 11, 2004   (KR) ..................... 10-2004-0016538

(51) Int. Cl.
*H01L 21/336* (2006.01)
(52) U.S. Cl. ...................... 438/303; 438/595
(58) Field of Classification Search ............... 438/303, 438/305, 306, 307, 595, 696
See application file for complete search history.

(56) References Cited

U.S. PATENT DOCUMENTS

| | | | |
|---|---|---|---|
| 5,559,049 A | 9/1996 | Cho | |
| 5,841,174 A * | 11/1998 | Arai | 257/392 |
| 6,037,639 A * | 3/2000 | Ahmad | 257/401 |
| 6,136,674 A * | 10/2000 | An et al. | 438/585 |
| 6,218,715 B1 * | 4/2001 | Kim et al. | 257/408 |
| 6,232,187 B1 * | 5/2001 | Kuroi et al. | 438/287 |
| 6,274,901 B1 * | 8/2001 | Odake et al. | 257/315 |
| 6,399,469 B1 | 6/2002 | Yu | |
| 6,437,377 B1 | 8/2002 | Ajmera et al. | |
| 6,455,383 B1 * | 9/2002 | Wu | 438/296 |
| 6,461,904 B1 | 10/2002 | Jin et al. | |
| 6,506,649 B2 | 1/2003 | Fung et al. | |
| 6,509,219 B2 | 1/2003 | Tsou et al. | |
| 6,528,363 B2 | 3/2003 | Ku et al. | |
| 6,541,320 B2 | 4/2003 | Brown et al. | |
| 6,611,031 B2 * | 8/2003 | Nakamura | 257/408 |
| 6,645,840 B2 | 11/2003 | Grider et al. | |
| 6,806,517 B2 * | 10/2004 | Kim et al. | 257/204 |
| 6,964,929 B1 * | 11/2005 | Narayanan et al. | 438/745 |

(Continued)

FOREIGN PATENT DOCUMENTS

WO   WO 00/34984 A2   6/2000

OTHER PUBLICATIONS

Tomoko Ogura et al., "Embedded Twin MONOS Flash Memories with 4ns and 15ns Fast Access Times", Symposium on VLSI Circuits Digest of Technical Papers, 2003, pp. 207-210.

*Primary Examiner*—M. Wilczewski
(74) *Attorney, Agent, or Firm*—Johnny A. Kumar; Justin T. Darrow; Heller Ehrman, LLP

(57) ABSTRACT

A transistor and a method for manufacturing the same are disclosed. One cell transistor having silicon-insulator-silicon ("SIS") structure and two cell transistors having silicon-oxide-nitride-oxide-silicon ("SONOS") structure constitute the transistor of the present invention which can store 2 bits. The cell transistor having SIS structure and the cell transistors having SONOS structure share one common gate electrode so that the transistor of the present invention requires only one voltage generation and control circuit.

6 Claims, 4 Drawing Sheets

U.S. PATENT DOCUMENTS

2001/0001296 A1* 5/2001 Kim et al. .................. 438/305
2002/0109197 A1* 8/2002 Nakamura ................. 257/408
2002/0149068 A1* 10/2002 Terauchi et al. ............ 257/413
2002/0163039 A1* 11/2002 Clevenger et al. .......... 257/340
2004/0245564 A1* 12/2004 Ogura et al. ................ 257/315
2005/0059211 A1* 3/2005 Yoshida ...................... 438/257

* cited by examiner

TRANSISTOR AND METHOD FOR MANUFACTURING THE SAME

BACKGROUND OF THE INVENTION

1. Field of the Invention

The present invention relates to transistor of semiconductor device and method for manufacturing the same, and in particular to an improved transistor of semiconductor device and a method for manufacturing the same wherein only one voltage generation and control circuit is required and formation of a source/drain region by self-align method is possible to reduce the cell and the chip areas and improve the yield and reliability of the device.

2. Description of the Background Art

A conventional Electrically Erasable Programmable Read Only Memory ("EEPROM") type floating gate flash memory employs a memory cell comprising a vertical stack of tunneling oxides, a first polysilicon layer disposed on the tunneling oxides, an oxide-nitride-oxide ("ONO") interlayer dielectric disposed on the first polysilicon layer and a second polysilicon layer disposed on the ONO interlayer dielectric.

Generally, a flash memory cell is programmed by inducing a hot electron injection from a portion of substrate such as a channel region, which is adjacent to a drain region, into floating gate. Negative charges are carried into the floating gate by the injection of electrons. Specifically, a source region and a bulk substrate are connected to ground, a relatively high positive voltage is applied to a control electrode to induce an electrical field, and a certain amount of positive voltage is applied to the drain region to generate "hot" (high energy) electron in order to induce the hot electron injection. The negative potential of the floating gate increases the threshold voltage and suppresses the current flow through the channel region during a subsequent read mode after a sufficient amount of negative charges is accumulated in the floating gate. The read current determines the programming of the flash memory cell. A discharge function of the floating gate of the flash memory cell is called an erase operation. Typically, the erase operation is performed by Fowler-Nordheim tunneling mechanism between the floating gate and the source region of a transistor (source-erase or negative gate-erase) or between the floating gate and the substrate (channel-erase). The source-erase operation is induced by applying a high voltage to the source region and a voltage of 0V to the control gate and to the substrate and by simultaneously floating the drain of each memory cell.

A silicon-oxide-nitride-oxide-silicon ("SONOS") type memory device has been introduced. A SONOS type flash memory cell electron typically comprises charge trapping non-conductive dielectric, i.e. two silicon oxide layers having a silicon nitride layer (insulation layer) therebetween. The non-conductive dielectric serves as an electrical electron-trapping medium. A conductive gate layer is disposed on the upper silicon oxide layer. Because the electrical charges are trapped in a portion adjacent to a drain region, this structure is a 2-transistor cell, i.e. two bits can be stored per cell. When multiple levels are used, four or more bits can be stored per cell. A multiple bit cell has advantages over other devices in that SONOS type memory device increases amount of information stored/processed in an integrated circuit.

FIG. 1 is a cross-sectional diagram illustrating a conventional transistor.

Referring to FIG. 1, a conventional SONOS cell transistor comprises a gate oxide film 12 disposed on a semiconductor substrate 10, a word line gate electrode 14 disposed thereon, an interlayer dielectric 26 including a stacked structure of an oxide film 16, a nitride film 18 and an oxide film 20 disposed on a side wall of word line gate electrode 14 and the semiconductor substrate 10 at both sides of word line gate electrode 14, a control gate electrode 22 disposed on the interlayer dielectric 26, and source/drain regions 24 disposed on an active region of semiconductor substrate 10 at both sides of the control gate 22.

The transistor has a structure including three transistors of a control transistor, word line transistor and another control transistor connected in series between source/drain regions. The threshold voltage of the control transistor is varied by the electrons trapped in the oxide-nitride-oxide ("ONO") insulating film under the control gate. Therefore, if in case that there are electrons in each ONO gate insulating film is designated as '0' (or '1') and in case that there are no electrons as '0' (or '1'), the above transistor structure is a 2 bit cell transistor which can store two '0's and '1's.

Table 1 below shows operation of the conventional transistor.

TABLE 1

|  |  | Word line gate | Control gate | Drain/source |
|---|---|---|---|---|
| Read | Select | 1.8 V | 1.8 V and >2.8 V | 1.5 V and 0 V |
|  | Unselect | 0 V | 1.8 V | 1.8 V |
| Program | Select | 1.0 V | 5.5 V and >2.8 V | 4.5 V or 0 V |
|  | Unselect | 0 V | 1.8 V | 1.8 V |
| Erase | Select | 0 or floating | −3 V | 4.5 V |
|  | Unselect |  | 0 V | 1.8 V or 0 V |

Referring to Table 1, it should be noted that program operation requires high voltages applied to the control gate and the drain/source region.

In accordance with the conventional transistor, three transistors including two control transistors and a word line transistor are used to store 2 bits of data and different voltages are applied to the control gate and the word line gate. Therefore, a voltage generation and control circuit for the control gate as well as a voltage generation and control circuit for the word line gate is required, resulting in an increase of chip area.

In addition, because the control gate is formed on the sidewall of the word line gate, a contact plug of the source/drain regions is not self-aligned. Therefore, the contact plug and the control gate must be spaced apart form each other to prevent short therebetween due to misalignment, resulting in an increase of cell area.

SUMMARY OF THE INVENTION

Accordingly, it is an object of the present invention to provide a transistor and method for manufacturing the same wherein only one voltage generation and control circuit is required and formation of a source/drain region by self-align method is possible to reduce the cell and the chip areas and improve the yield and reliability of the device.

In order to achieve the above-described object of the invention, there is provided a transistor, comprising: a gate oxide film pattern disposed on a semiconductor substrate; a stacked structure of a gate electrode and a hard mask film pattern disposed on the gate oxide film pattern, wherein a width of the stacked structure is larger than that of the gate oxide film pattern; an oxide film pattern covering a sidewall and a portion of a lower surface of the gate electrode and an upper surface of the semiconductor substrate; an insulating film spacer disposed on a side wall of the stacked structure, wherein the insulating film spacer fills the space between the lower surface of the gate electrode and the upper surface of the semiconductor substrate; and a source/drain region disposed on the semiconductor substrate at both sides of the gate electrode.

In order to achieve the above-described object of the invention, there is also provided a method for manufacturing a transistor, the method comprising the steps of: sequentially forming a gate oxide film, a polysilicon film for gate electrode and a hard mask film on a semiconductor substrate; patterning the hard mask film and the polysilicon film for gate electrode via a photolithography process using a gate mask to form a stacked structure of a gate electrode having two sidewalls and a hard mask film pattern; performing a first thermal oxidation process to form a first thermal oxide film by oxidizing the two sidewalls of the gate electrode and an upper surface of the gate oxide film, wherein the first thermal oxide film has a protruding portion extending into a lower portion of the gate electrode; performing an ion implant process using the hard mask film pattern as an implant mask to form a source/drain region on the semiconductor substrate at both sides of the gate electrode; removing a portion of the first thermal oxide film and the gate oxide film therebelow so as to expose at least one sidewall and the lower portion of the gate electrode and the semiconductor substrate; performing a second thermal oxidation process to form a second thermal oxide film by oxidizing the exposed portion of the gate electrode and the semiconductor substrate; and forming an insulating film spacer on sidewalls of the stacked structure, wherein the insulating film spacer fills the space between the lower surface of the gate electrode and the upper surface of the semiconductor substrate.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A transistor in accordance with a preferred embodiment of the present invention will now be described in detail with reference to the accompanying drawings.

Figure 1:
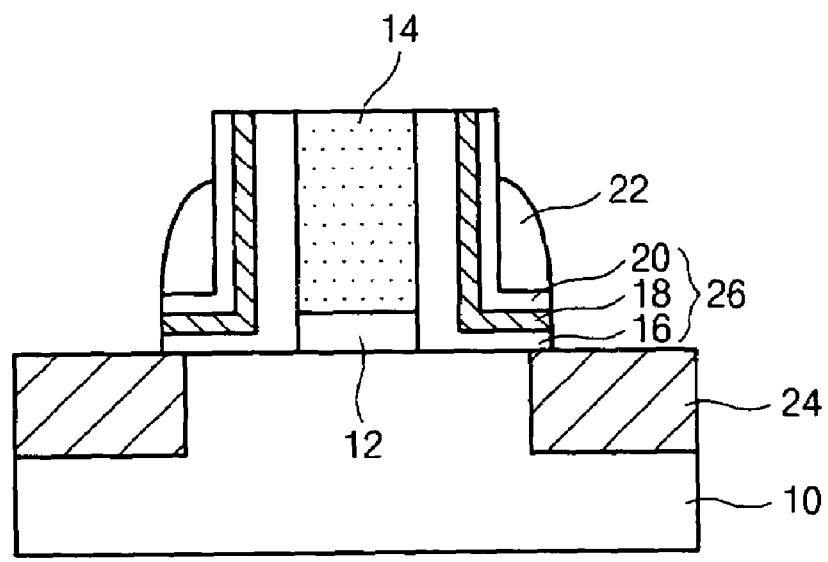
FIG. 1 is a cross-sectional diagram illustrating a conventional transistor.
Figure 2:
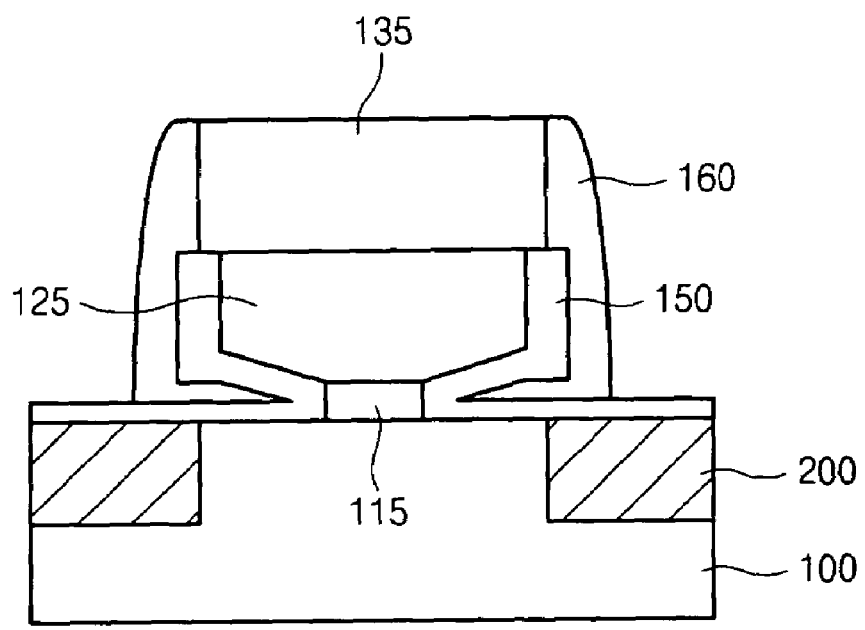
FIG. 2 is a cross-sectional diagram illustrating a transistor in accordance with a first embodiment of the present invention.

FIG. 2 is a cross-sectional diagram illustrating a transistor in accordance with a first embodiment of the present invention.

Referring to FIG. 2, the transistor of the present invention comprises a gate oxide film pattern 115 disposed on a semiconductor substrate 100, a stacked structure of a gate electrode 125 and a hard mask film pattern 135 disposed on the gate oxide film pattern 115. The width of the stacked structure is larger than that of the gate oxide film pattern 115.

The transistor also comprises an oxide film pattern 150 covering a sidewall and a portion of a lower surface of the gate electrode 125 and an upper surface of the semiconductor substrate 100. An insulating film spacer 160 filling the space between the lower surface of the gate electrode 125 and the upper surface of the semiconductor substrate 100 is disposed on a side wall of the stacked structure. Preferably, the insulating film spacer 160 comprises a nitride film, a stacked structure of a nitride film and an oxide film or a stacked structure of a first nitride film, an oxide film and a second nitride film. It should be noted that the insulating film spacer 160 comprises at least one nitride film and the nitride film fills the space between the lower surface of the gate electrode 125 and the upper surface of the semiconductor substrate 100.

The transistor further comprises source/drain regions 200 disposed on the semiconductor substrate 100 at both sides of the gate electrode 125.

As shown in FIG. 2, a word line transistor in the center, which is structured by the semiconductor substrate 100-the gate oxide film pattern 115-the gate electrode 125, and two control transistors at both sides of the word line transistor, each of which is structured by the semiconductor substrate 100-the oxide film pattern 150-the insulating film spacer 160-the oxide film pattern 150-the gate electrode 125, constitute the transistor of the present invention. The three transistors are connected in series between the source/drain regions 200.

If in case that there are electrons in the nitride film in each oxide-nitride-oxide ("ONO") insulating film is designated as '0' (or '1') and in case that there are no electrons as '0' (or '1'), the transistor of the present invention is a single gate 2-bit cell transistor which can store two '0's and '1's.

Table 2 below shows operation of the transistor in accordance with the present invention.

TABLE 2

| | | Word line gate | Drain/source |
|---|---|---|---|
| Read | Select | $V_{DD}$ | $V_{DD}$ and 0V |
| | Unselect | 0 V | $V_{DD}$ |
| Program | Select | $V_{PROGRAM}$ | $V_{PROGRAM}$ or 0 V |
| | Unselect | 0 V | $V_{DD}$ |
| Erase | Select | <0 | $V_{ERASE}$ |
| | Unselect | 0 V | $V_{DD}$ |

Referring to Table 2, it should be noted that the transistor of the present invention does not require a voltage generation and control circuit for the control gate and voltages are applied to the control gate through the voltage generation and control circuit for the word line gate.

A method for manufacturing the transistor in accordance with a preferred embodiment of the present invention will now be described in detail.

FIGS. 3a through 3e are cross-sectional diagrams illustrating method for manufacturing transistor shown in FIG. 2.

Figure 3A:
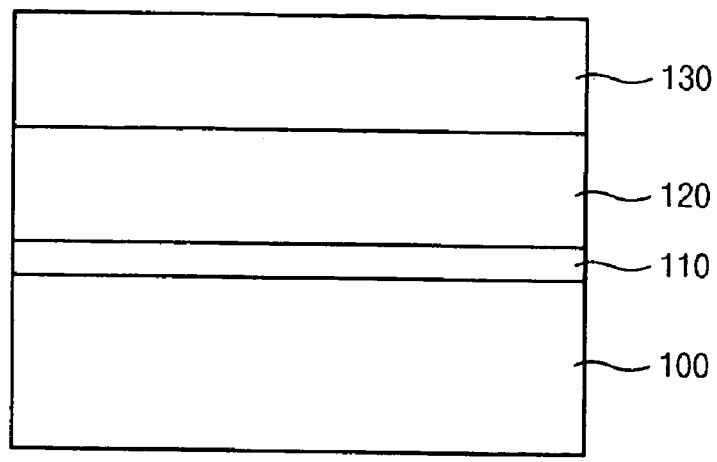
FIGS. 3a through 3e are cross-sectional diagrams illustrating method for manufacturing transistor shown in FIG. 2.

Referring to FIG. 3a, a gate oxide film 110, a polysilicon film 120 and a hard mask film 130 are sequentially formed on a semiconductor substrate 100. Preferably, the hard mask film 130 comprises a nitride film.

Figure 3B:
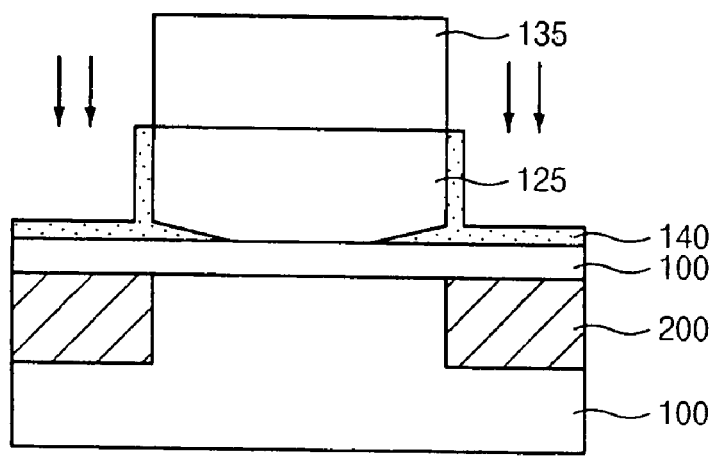

Referring to FIG. 3b, the hard mask film 130 and the polysilicon film 120 is patterned via a photolithography process using a gate mask (not shown) to form a stacked structure of a gate electrode 125 having two sidewalls and a hard mask film pattern 135.

Thereafter, a first thermal oxidation process is performed to form a first thermal oxide film 140. The two sidewalls of the gate electrode 125 and an upper surface of the gate oxide film 110 are oxidized by the first thermal oxidation process. In the first thermal oxidation process, a lower portion of the gate electrode 125 is also oxidized so that the first thermal oxide film 140 includes a protruding portion extending into the lower portion of the gate electrode 125. Preferably, the protruding portion has a length ranging from 5 to 100 nm.

An ion implant process using the hard mask film pattern 135 as an implant mask is then performed to form a source/drain region 200 on the semiconductor substrate 100 at both sides of the gate electrode 125.

Figure 3C:
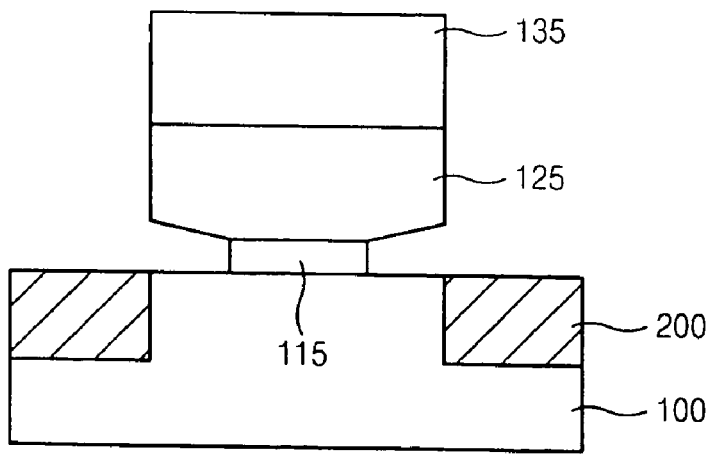

Now referring to FIG. 3c, the first thermal oxide film 140 and the gate oxide film 110 therebelow are removed to form a gate oxide film pattern 115. The two sidewalls and the lower portion of the gate electrode 125 and the semiconductor substrate 100 are exposed after the removal process. The removal process preferably comprises a wet etch process.

Figure 3D:
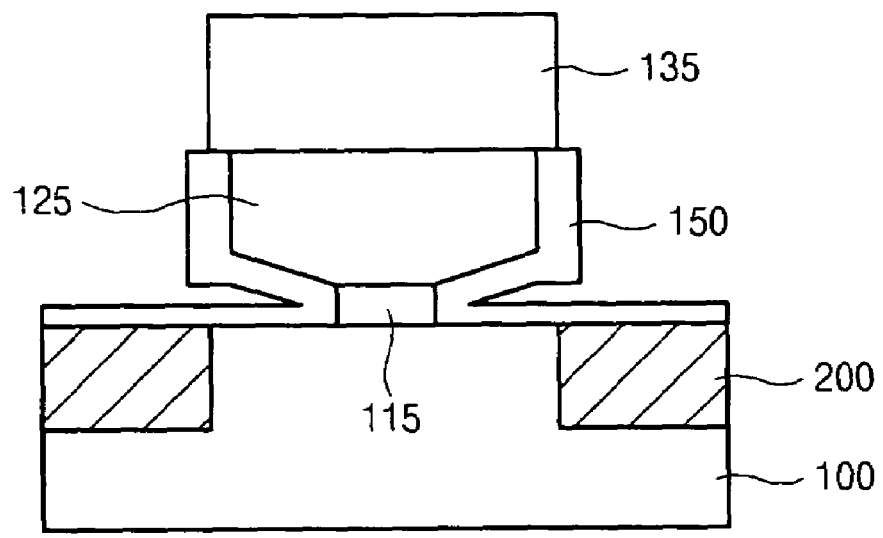

Referring to FIG. 3d, a second thermal oxidation process is performed to form a second thermal oxide film 150. The exposed portions of the gate electrode 125, i.e. the two sidewalls and the lower portion of the gate electrode 125, and the semiconductor substrate 100 are oxidized by the second thermal oxidation process.

Figure 3E:
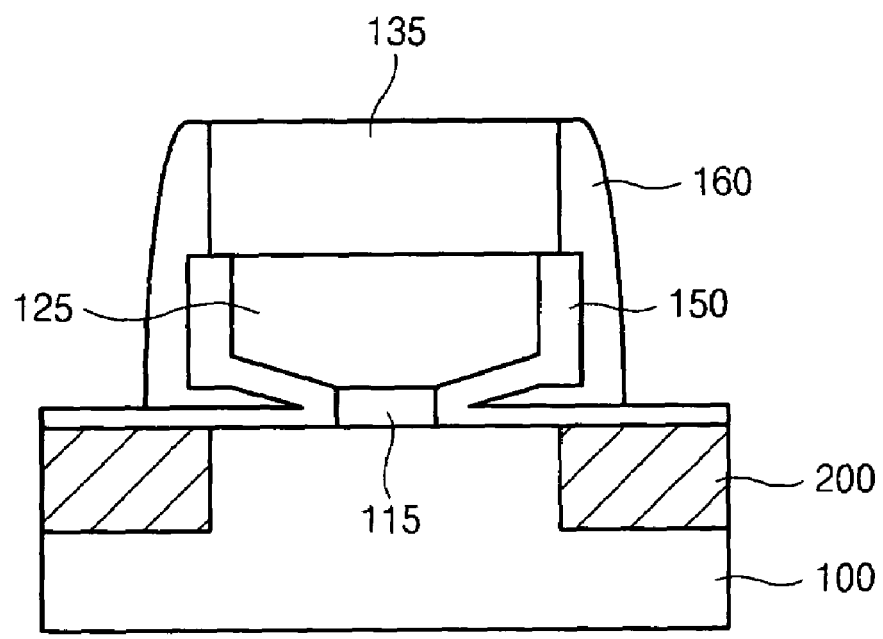

Referring to FIG. 3e, an insulating film spacer 160 is formed on sidewalls of the stacked structure. The insulating film spacer 160 at least fills the space between the lower surface of the gate electrode 125 and the upper surface of the semiconductor substrate 100. Preferably, the processes for forming the insulating film spacer 160 are as follows.

(1) A nitride film at least filling the space between the lower surface of the gate electrode 125 and the upper surface of the semiconductor substrate 100 is formed on the entire surface of the semiconductor substrate 100 and then etched back to form the insulating film spacer 160.

(2) A nitride film at least filling the space between the lower surface of the gate electrode 125 and the upper surface of the semiconductor substrate 100 and an oxide film are sequentially formed on the entire surface of the semiconductor substrate 100 and then etched back to form the insulating film spacer 160 having a dual-layer spacer structure.

(3) A first nitride film filling the space between the lower surface of the gate electrode 125 and the upper surface of the semiconductor substrate 100 is formed. An oxide film and a second nitride film are sequentially formed on the entire surface of the semiconductor substrate 100 and then etched back to form the insulating film spacer 160 having a dual-layer spacer structure.

(4) A first spacer at least filling the space between the lower surface of the gate electrode and the upper surface of the semiconductor substrate is formed on the sidewalls of the stacked structure. The first spacer preferably comprises a film selected from the group containing NO film, $Al_2O_3$ film and $HfO_2$ film. A second spacer preferably comprising a nitride film is formed on the first spacer.

The transistor manufactured by the method shown in FIGS. 3a through 3e requires only one voltage generation and control circuit because it includes single common gate electrode formed on an ONO-oxide-ONO insulating film. In addition, it is possible to form CVD nitride film or CVD oxide film on sidewalls of the gate electrode and to employ self-align method between the gate electrode and the source/drain contact because it includes single common gate electrode. Therefore, space between the source/drain region and the gate electrode is not needed. These advantages lead to reduction of cell area.

Figure 4A:
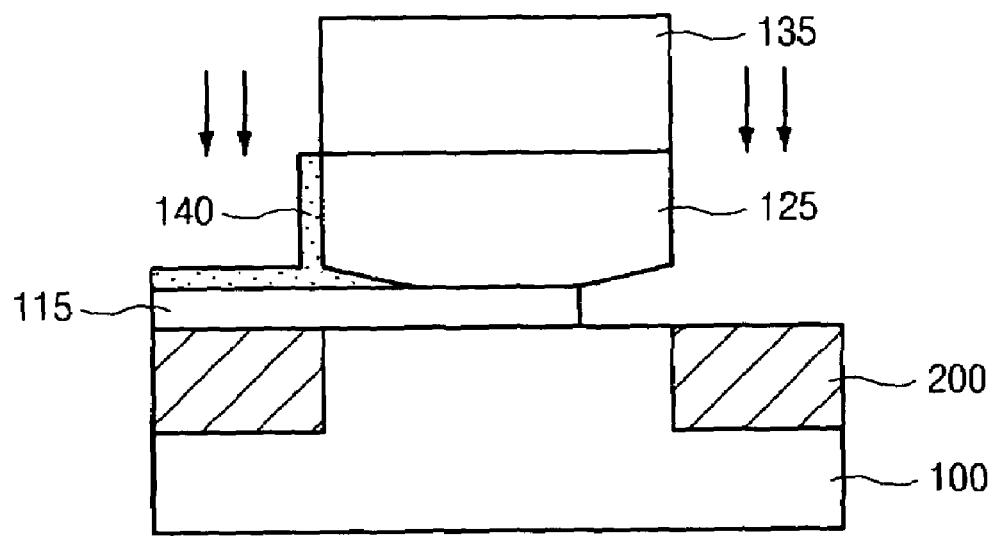
FIGS. 4a and 4b are cross-sectional diagrams illustrating method for manufacturing transistor in accordance with second embodiment of the present invention.
Figure 4B:
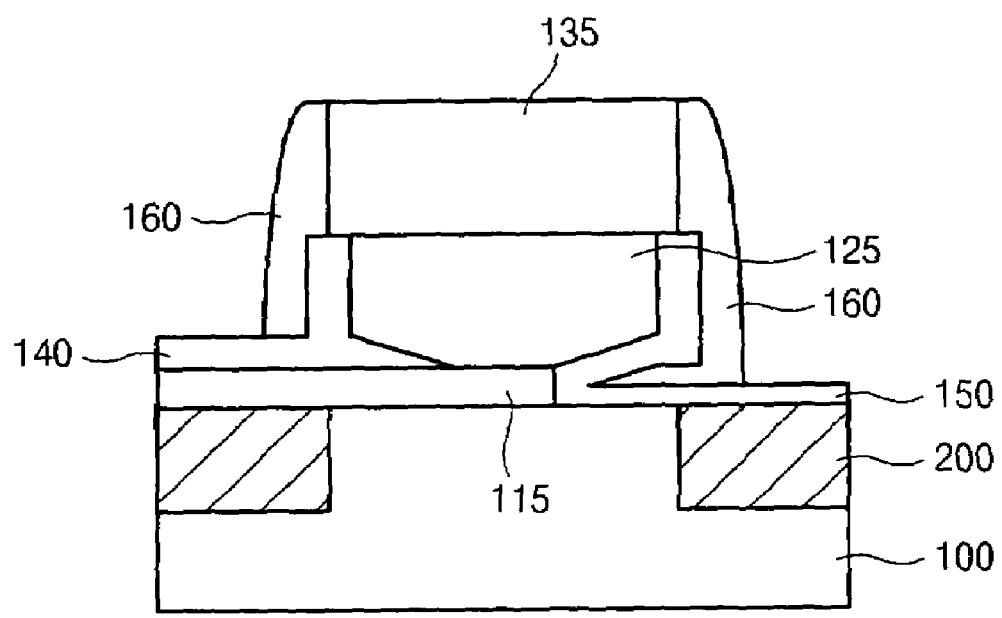

FIGS. 4a and 4b are cross-sectional diagrams illustrating method for manufacturing transistor in accordance with another embodiment of the present invention.

First, the processes shown in FIGS. 3a and 3b are performed to form the structure shown in FIG. 3b.

Now referring to FIG. 4a, a portion of the first thermal oxide film 140 on one sidewall of the gate electrode 125 and the gate oxide film 110 therebelow are removed to form a gate oxide film pattern 115. One sidewall, the lower portion of the gate electrode 125 adjacent to the sidewall where the portion of the first thermal oxide film 140 was removed therefrom and the semiconductor substrate 100 are exposed after the removal process. The removal process preferably comprises a wet etch process.

Referring to FIG. 4b, a second thermal oxidation process is performed to form a second thermal oxide film 150. The exposed portions of the gate electrode 125 including the sidewall and the lower portion of the gate electrode 125, the semiconductor substrate 100 and the remaining portion of the first thermal oxide film 140 are oxidized by the second thermal oxidation process. Since the first thermal oxide film 140 is additionally oxidized, the first thermal oxide film 140 may become thicker after the second thermal oxidation process.

Thereafter, an insulating film spacer 160 is formed on sidewalls of the stacked structure. The insulating film spacer 160 at least fills the space between the lower surface of the gate electrode 125 and the upper surface of the semiconductor substrate 100. Preferably, the processes for forming the insulating film spacer 160 are similar to the formation processes of the insulating film spacer disclosed in the first embodiment of the present invention shown in FIG. 3e.

The transistor manufactured by the method shown in FIGS. 3a, 3b, 4a and 4b includes a word line gate electrode and a control gate electrode formed on one side of the word line gate electrode. The transistor is a single gate 1-bit transistor which can store one '0' and '1' (or '1' and '0')

As discussed earlier, in accordance with the present invention, one cell transistor having silicon-insulator-silicon ("SIS") structure and one or two cell transistors having silicon-oxide-nitride-oxide-silicon ("SONOS") structure are formed as a 1-bit or 2-bit cell transistor having one common gate electrode, thereby requiring only one voltage generation and control circuit and allowing the formation of a source/drain region contact by self-align method to reduce the cell and the chip areas and improve the yield and reliability of the device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing a transistor, the method comprising the steps of:
   sequentially forming a gate oxide film, a polysilicon film for gate electrode and a hard mask film on a semiconductor substrate;
   patterning the hard mask film and the polysilicon film for gate electrode via a photolithography process using a gate mask to form a stacked structure of a gate electrode having two sidewalls and a hard mask film pattern;

performing a first thermal oxidation process to form a first thermal oxide film by oxidizing the two sidewalls of the gate electrode and an upper surface of the gate oxide film, wherein the first thermal oxide film has a protruding portion extending into a lower portion of the gate electrode;

performing an ion implant process using the hard mask film pattern as an implant mask to form a source/drain region on the semiconductor substrate at both sides of the gate electrode;

removing a portion of the first thermal oxide film and the gate oxide film therebelow so as to expose at least one sidewall and the lower portion of the gate electrode and the semiconductor substrate;

performing a second thermal oxidation process to form a second thermal oxide film by oxidizing the exposed portion of the gate electrode and the semiconductor substrate; and forming an insulating film spacer on sidewalls of the stacked structure, wherein the insulating film spacer fills the space between the lower surface of the gate electrode and the upper surface of the semiconductor substrate.

2. The method according to claim 1, wherein the protruding portion extends 5 to 100 nm into a lower portion of the gate electrode.

3. The method according to claim 1, wherein the step of forming an insulating film spacer comprises:

forming a nitride film on the semiconductor substrate, wherein the insulating film at least fills the space between the lower surface of the gate electrode and the upper surface of the semiconductor substrate;

performing an etch-back process to etch the nitride film.

4. The method according to claim 1, wherein the step of forming an insulating film spacer comprises:

forming a nitride film on the semiconductor substrate, wherein the insulating film at least fills the space between the lower surface of the gate electrode and the upper surface of the semiconductor substrate;

forming an oxide film on the nitride film; and performing an etch-back process to etch the nitride film and the oxide film.

5. The method according to claim 1, wherein the step of forming an insulating film spacer comprises:

forming a first nitride film filling the space between the lower surface of the gate electrode and the upper surface of the semiconductor substrate;

sequentially forming an oxide film and a second nitride film on the first nitride film; and performing an etch-back process to etch the second nitride film and the oxide film.

6. The method according to claim 1, wherein the step of forming an insulating film spacer comprises:

forming a first spacer at least filling the space between the lower surface of the gate electrode and the upper surface of the semiconductor substrate on the sidewalls of the stacked structure, wherein the first spacer comprises a film selected from the group containing NO film, $Al_2O_3$ film; and forming a second spacer on the first spacer, wherein the second spacer comprises a nitride film.

* * * * *